United States Patent
Padalia et al.

(10) Patent No.: US 9,594,859 B1
(45) Date of Patent: Mar. 14, 2017

(54) APPARATUS AND ASSOCIATED METHODS FOR PARALLELIZING CLUSTERING AND PLACEMENT

(75) Inventors: Ketan Padalia, Thornhill (CA); Adrian Ludwin, Toronto (CA); Ryan Fung, Mississauga (CA); Vaughn Betz, Toronto (CA)

(73) Assignee: Altera Corporation, San Jose, CA (US)

(*) Notice: Subject to any disclaimer, the term of this patent is extended or adjusted under 35 U.S.C. 154(b) by 1642 days.

(21) Appl. No.: 12/040,730

(22) Filed: Feb. 29, 2008

Related U.S. Application Data (60) Provisional application No. 60/892,776, filed on Mar. 2, 2007.

(51) Int. Cl.
G06F 17/50 (2006.01)
G06F 17/10 (2006.01)

(52) U.S. Cl.
CPC .......... *G06F 17/5036* (2013.01); *G06F 17/10* (2013.01)

(58) Field of Classification Search
CPC ..... B82Y 10/00; G06F 17/5072; G06F 15/16; G06F 15/17387; G06F 15/7807; G06F 17/5027; G06F 17/5036; G06F 17/5045; G06F 17/505; G06F 17/5054; G06F 17/509; G06F 1/10; G06F 2217/74; G06F 15/173; G06F 17/5068; G06F 11/261; G06F 17/5022; G06F 11/226; G11C 13/0014
USPC ................................... 716/116–120
See application file for complete search history.

(56) References Cited

U.S. PATENT DOCUMENTS

| | | | | |
|---|---|---|---|---|
| 5,909,376 A * | 6/1999 | Scepanovic et al. | ......... | 716/123 |
| 6,067,409 A * | 5/2000 | Scepanovic | ......... | G06F 17/5072 716/119 |
| 6,080,204 A * | 6/2000 | Mendel | ............... | G06F 17/5054 716/103 |
| 6,292,929 B2 * | 9/2001 | Scepanovic | ................... | 716/118 |
| 7,103,823 B2 * | 9/2006 | Nemawarkar et al. | ........ | 714/758 |
| 7,117,419 B2 * | 10/2006 | Nemawarkar et al. | ........ | 714/758 |
| 7,203,914 B2 * | 4/2007 | Wood | ............................ | 716/113 |
| 7,917,877 B2 * | 3/2011 | Singh et al. | ................... | 716/118 |
| 2005/0034007 A1 * | 2/2005 | Nemawarkar et al. | ........ | 713/500 |
| 2007/0168789 A1 * | 7/2007 | Udell | ............................ | 714/724 |

* cited by examiner

*Primary Examiner* — Binh Tat
(74) *Attorney, Agent, or Firm* — Michael H. Lyons (57) ABSTRACT

A system for parallelizing software in computer-aided design (CAD) software for circuit design includes a computer. The computer is configured to form or optimize a plurality of clusters in parallel. Each cluster in the plurality of clusters includes a set of nodes in a netlist in a design. The computer is configured to determine placements for blocks in a netlist in parallel, based on iterative improvement, partitioning, or analytic techniques.

33 Claims, 10 Drawing Sheets

APPARATUS AND ASSOCIATED METHODS FOR PARALLELIZING CLUSTERING AND PLACEMENT

CROSS-REFERENCE TO RELATED APPLICATIONS

This patent application claims priority to, and incorporates by reference, Provisional U.S. Patent Application Ser. No. 60/892,776, filed on Mar. 2, 2007, titled "Apparatus and Associated Methods for Multi-Threading Clustering and Placement Reduce Compile Time." Furthermore, this application incorporates by reference U.S. patent application Ser. No. 11/382,215, filed on Mar. 29, 2006, titled "Apparatus And Methods For Parallelizing Integrated Circuit Computer-Aided Design Software," and U.S. patent application Ser. No. 12/037,329, filed on Feb. 26, 2008, titled "Apparatus and Methods for Parallelizing Integrated Circuit Computer-Aided Design Software."

TECHNICAL FIELD

Generally, the disclosed concepts relate to apparatus and methods for computer-aided design (CAD) software for integrated circuits (ICs), such as programmable logic devices (PLDs). More specifically, they relate to multi-threading or parallelizing clustering and/or placement algorithms and related techniques.

BACKGROUND

Traditionally, processors (such as the Pentium series from Intel, Athlon series from AMD, etc) have become faster by supporting ever-increasing clock speeds. As processors got faster in this way, the time used up to run a particular piece of software on these processors automatically sped up proportionally (because the time to execute a single instruction of code is roughly proportional to the speed of the processor clock).

New generations of processors being released today, however, are not using clocks that are significantly faster than they were two years ago (about 3 GHz). Instead, these processor chips now include more than one processor inside them (e.g., Pentium D processors are "dual core," meaning they have two mini-processors in one chip). This property enables the computer to simultaneously run several "threads" of execution, or run software in parallel.

SUMMARY

The disclosed concepts contemplate apparatus and associated methods for parallelizing or multi-threading clustering and/or placement algorithms. In one exemplary embodiment, a system for parallelizing software in computer-aided design (CAD) software for circuit design includes a computer. The computer forms a plurality of clusters in parallel. Each cluster in the plurality of clusters includes a set of nodes in a netlist.

Another exemplary embodiment relates to a system for parallelizing software in computer-aided design (CAD) software for circuit design. The system includes a computer that performs cluster legality checking or cluster affinity updates in parallel. Yet another illustrative embodiment is for a system for parallelizing software in computer-aided design (CAD) software for circuit design. The system includes a computer configured to optimize a plurality of clusters in parallel. Each cluster in the plurality of clusters includes a set of nodes in a netlist in a design. Another exemplary embodiment according to the disclosed concepts relates to a system for parallelizing software in computer-aided design (CAD) software for circuit design. The system includes a computer. The computer determines placements for blocks in a netlist by performing a set of operations in parallel.

BRIEF DESCRIPTION OF THE DRAWINGS

The appended drawings illustrate only exemplary embodiments of the disclosed concepts and therefore should not be considered or construed as limiting their scope. Persons of ordinary skill in the art who have the benefit of the description of the disclosed concepts appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts contemplate apparatus and associated methods for parallelizing or multi-threading clustering and/or placement algorithms. Without lack of generality, the description in this patent document may refer to "multi-threading" or "parallelizing" interchangeably. Without loss of generality, either term refers to performing clustering tasks in parallel, rather than serially, using, for example, multiple threads or other techniques, as persons of ordinary skill in the art who have the benefit of the description of the disclosed concepts understand.

Clustering algorithms are algorithms that create groupings (or "clusters") of nodes in a netlist in a design (for example, as a user's design or circuit to be implemented using a PLD). This is often done to allow subsequent algorithms to work with the groups instead of the nodes themselves, allowing these subsequent algorithms to run faster since they deal with fewer entities, and potentially get better results by simplifying the optimization problem. For example, a netlist with 1,000 elements in it can be clustered into 100 groups (i.e., so that each group has an average of 10 elements in it). A subsequent algorithm (e.g., one that creates an initial placement) would work with the 100 clusters instead of the full netlist of 1,000 elements. Clustering can also be performed hierarchically, in which case clusters of clusters, clusters of those clusters, etc., are created.

This approach relies on the clustering algorithms creating intelligent groupings. For the example above, if all 10 elements in a given group are ideally placed in a similar area of the chip, the grouping is intelligent or desirable because the cluster can be placed in that area to satisfy all elements. If, on the other hand, each of the 10 elements are ideally placed in different areas of the chip, the grouping is relatively poor because no one place for the cluster will satisfy all 10 elements. There can be other metrics by which the group quality can be judged as well (e.g., timing performance, power, and the like).

Figure 1:
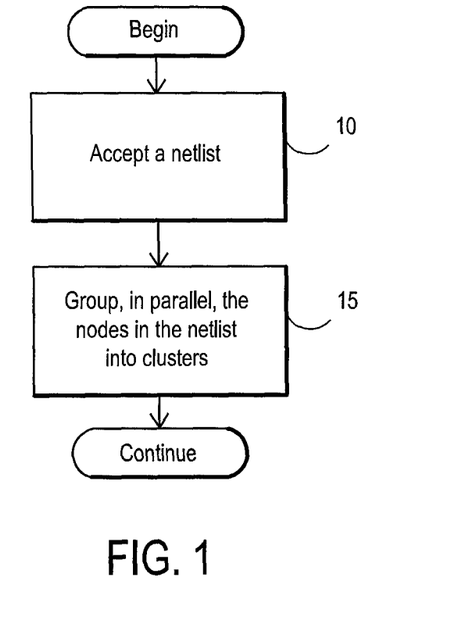
FIG. 1 shows a simplified flowchart of a method for parallelizing clustering according to exemplary embodiments.

Generally speaking, the disclosed concepts relate to apparatus, methods, and systems for parallelizing clustering. FIG. 1 shows a simplified block diagram of a method for parallelizing clustering. At 10, the method accepts a netlist. The netlist may constitute part or all of a desired circuit. At 15, the method forms or groups, in parallel, the nodes in the netlist into clusters, using one or more of the techniques disclosed below in detail.

Figure 2:
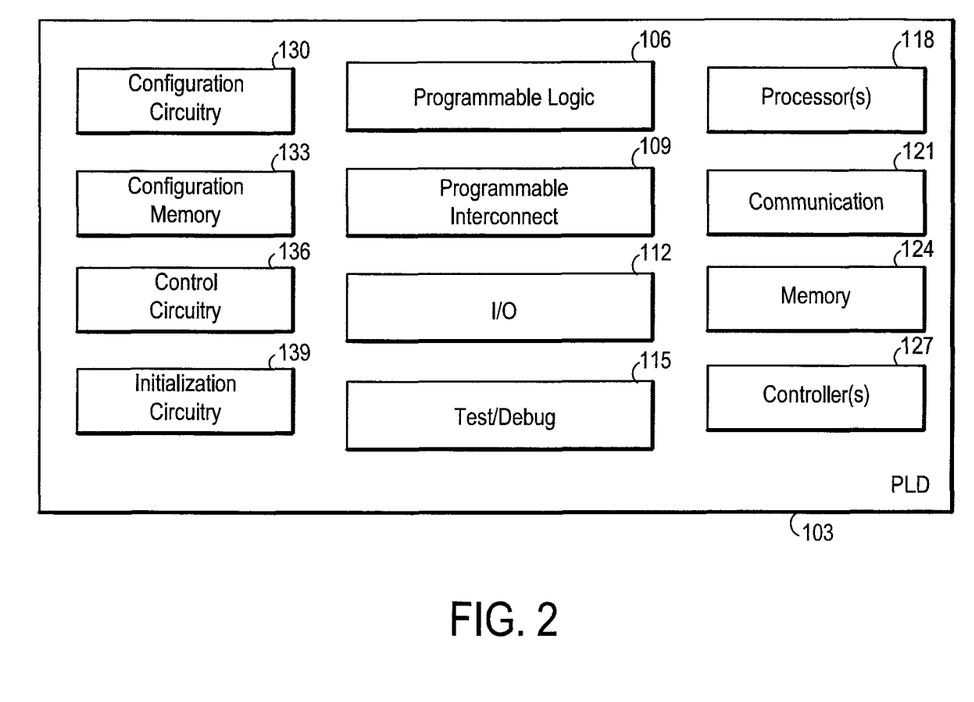
FIG. 2 depicts a general block diagram of a PLD that may be designed or used by using illustrative embodiments.

FIG. 2 depicts a general block diagram of a PLD that may be designed or used via illustrative embodiments of the invention. One may use the disclosed concepts for parallelizing software in CAD software for designing PLD 103 or using its resources to implement a desired circuit or system.

PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, and initialization circuit 139, as desired.

Note that the figure shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 3:
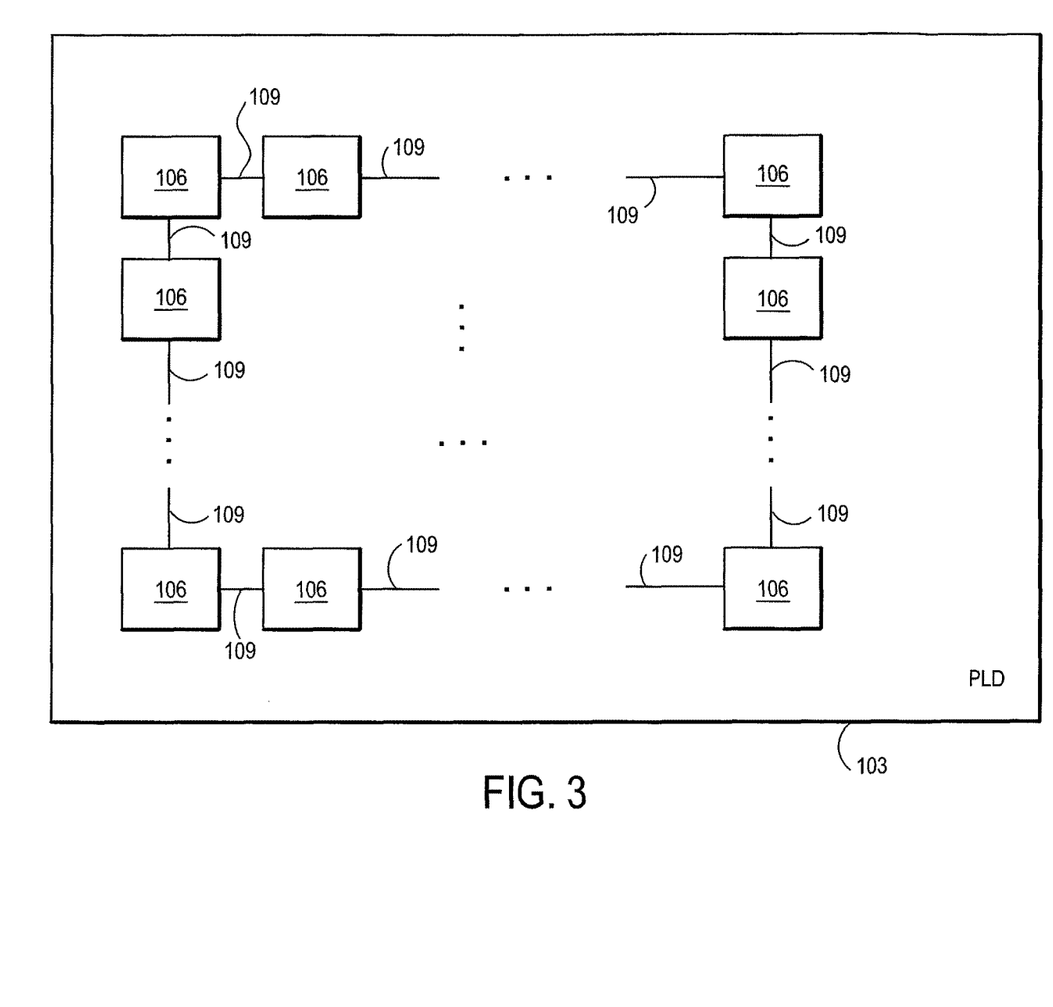
FIG. 3 shows a floor-plan of a PLD that one may design or implement by using the disclosed concepts.

As noted, PLD 103 includes a number of blocks of programmable resources. Implementing a design using those resources often entails placement of those blocks (described below) within PLD 103's floorplan. FIG. 3 shows a floorplan of a PLD that one may design or implement by using the inventive concepts.

PLD 103 includes programmable logic 106 arranged as a two-dimensional array. Programmable interconnect 109, arranged as horizontal interconnect and vertical interconnect, couples the blocks of programmable logic 106 to one another. One may place the blocks in a particular manner so as to implement a user's design, as persons of ordinary skill in the art who have the benefit of the description of the invention understand.

In illustrative embodiments, PLD 103 has a hierarchical architecture. In other words, each block of programmable logic 106 may in turn include smaller or more granular programmable logic blocks or circuits. For example, in one embodiment, programmable logic 106 may constitute blocks of configurable logic named logic array block (LAB), and each LAB may include logic elements (LEs) or other circuitry, as desired.

Persons of ordinary skill in the art who have the benefit of the description of the invention understand, however, that a wide variety of other arrangements, with varying terminology and topology, are possible, and fall within the scope of the inventive concepts. Furthermore, although FIG. 3 shows blocks of programmable logic 106, one may use PLDs with other or additional blocks (e.g., memory, processors, other blocks in FIG. 2, etc.) in their floorplans and take advantage of the inventive concepts, as persons of ordinary skill in the art who have the benefit of the description of the invention understand.

Regardless of the particular arrangement or design, however, one may use the inventive concepts in CAD software (e.g., in one or more areas, steps, or blocks of CAD software, described below in detail) or programs to exploit the PLD's resources and implement a desired circuit or system. Implementing a user's design in a PLD, such as PLD 103, entails a number of steps or processes, as detailed below.

Figure 4:
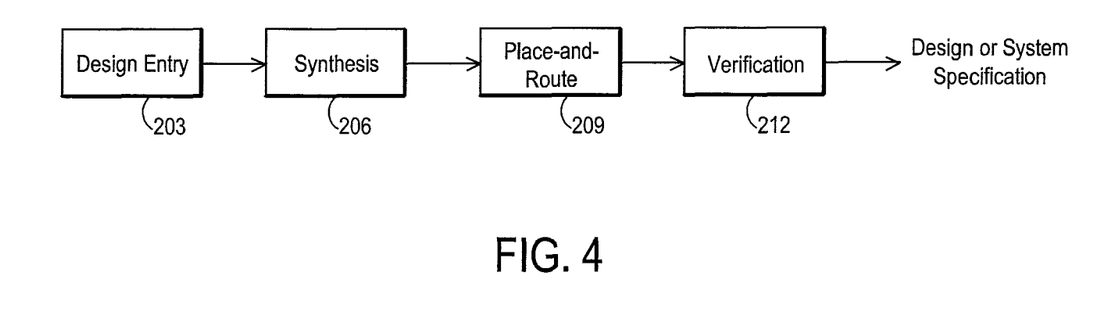
FIG. 4 illustrates various software modules that PLD CAD software according to illustrative embodiments uses.

FIG. 4 illustrates various software modules that PLD CAD software according to illustrative embodiments of the invention uses. The modules include design-entry module 203, synthesis module 206, place-and-route module 209, and verification module 212. The following description provides a simplified explanation of the operation of each module.

The CAD techniques may have a variety of applications, as persons of ordinary skill in the art who have the benefit of the description of the invention understand. Design-entry module 203 allows the editing of various design description files using graphical or textual descriptions of a circuit or its behavior, such as schematics, hardware description languages (HDL), or waveforms, as desired. The user may generate the design files by using design-entry module 203 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 206 accepts the output of design-entry module 203. Based on the user-provided design, synthesis module 206 generates appropriate logic circuitry that realizes the user-provided design. One or more PLDs (not shown explicitly) implement the synthesized overall design or system. Synthesis module 206 may also generate any glue logic that allows integration and proper operation and interfacing of various modules in the user's designs. For example, synthesis module 206 provides appropriate hardware so that an output of one block properly interfaces with an input of another block. Synthesis module 206 may provide appropriate hardware so as to meet the specifications of each of the modules in the overall design or system.

Furthermore, synthesis module 206 may include algorithms and routines for optimizing the synthesized design. Through optimization, synthesis module 206 seeks to more efficiently use the resources of the one or more PLDs that implement the overall design or system. Synthesis module 206 provides its output to place-and-route module 209.

Place-and-route module 209 uses the designer's timing specifications to perform placement and routing. The placement determines the use of logic resources within the PLD(s). The routing determines the use of interconnect resources within the PLD(s). In other words, by use of particular programmable logic and interconnect resources with the PLD(s) for certain parts of the design, place-and-route module 209 helps optimize the performance of the overall design or system.

Place-and-route module 209 optimizes the critical timing paths to help provide timing closure faster in a manner known to persons of ordinary skill in the art with the benefit of the description of the invention. As a result, the overall design or system can achieve faster performance (i.e., operate at a higher clock rate or have higher throughput).

Verification module 212 performs simulation and verification of the design. The simulation and verification seek in part to verify that the design complies with the user's prescribed specifications. The simulation and verification also aim at detecting and correcting any design problems before prototyping the design. Thus, verification module 212 helps the user to reduce the overall cost and time-to-market of the overall design or system.

Verification module 212 may support and perform a variety of verification and simulation options, as desired. The options may include functional verification, test-bench generation, static timing analysis, timing simulation, hardware/software simulation, in-system verification, board-level timing analysis, signal integrity analysis and electromagnetic compatibility (EMC), formal netlist verification, and the like, as persons of ordinary skill in the art who have the benefit of the description of the invention understand.

Note that one may perform other or additional verification techniques as desired and as persons of ordinary skill in the art who have the benefit of the description of the invention understand. Verification of the design may also be performed at other phases in the flow, as appropriate, and as desired.

(a) Parallelizing or Multi-Threading of Clustering

A common clustering algorithm is to create the clusters "bottom-up," by putting one element or node in a cluster and then bringing other (usually related) elements into the same cluster. In a serial algorithm, one cluster is typically completed before the next is started. It is possible to multi-thread such a clustering algorithm by allowing multiple clusters to be created simultaneously, one for each thread available for execution, to create multiple clusters in parallel that the serial algorithm would create sequentially. As one exemplary embodiment, one may use a scheduler and set of independent tasks similar to those described in U.S. patent application Ser. No. 11/382,215, referenced above, for this application (the tasks are defined as addition of a given block to a given cluster in this case). To help ensure task independence, the multiple clusters can be grown from independent or mostly or substantially independent portions or nodes in the design or circuit (i.e., nodes that are independent or sufficiently independent so as to allow forming multiple clusters in parallel), so that the decisions made for one cluster do not affect any other.

Another possibility is to parallelize in a more fine-grained fashion the tasks needed to build a single cluster. For example, growing a single cluster usually involves legality checking and affinity updates (preferences for which elements should be added to the cluster). Legality checking can involve a relatively large number of independent operations which are easily parallelized. Similarly, affinity updates can be done in parallel with legality checking.

Another type of serial clustering algorithm is to grow multiple clusters simultaneously. All tentative clusters compete for elements, and the next element added to any cluster is the most desirable cluster-element pairing of those being considered. Given that multiple clusters are being processed, there are a relatively large number of opportunities for parallelization. Legality checking possible cluster-element pairings to remove illegal candidates can be done in parallel. Affinity updates of multiple clusters can be done in parallel after a cluster-element pairing is made.

(b) Parallelizing or Multi-Threading of Clustering by Using Iterative Improvement One algorithm that can be used to improve the quality of clustering is an iterative improvement algorithm. This iterative improvement starts with an initial grouping created by a clustering algorithm and outputs an improved grouping. One way an iterative improvement algorithm can work to improve clusters is by selecting a pair of clusters, and then swapping elements between that pair of clusters. The swaps are evaluated by a cost function that determines which swaps are worth making (e.g., those that improve routability, timing performance, power, etc.).

Figure 5:
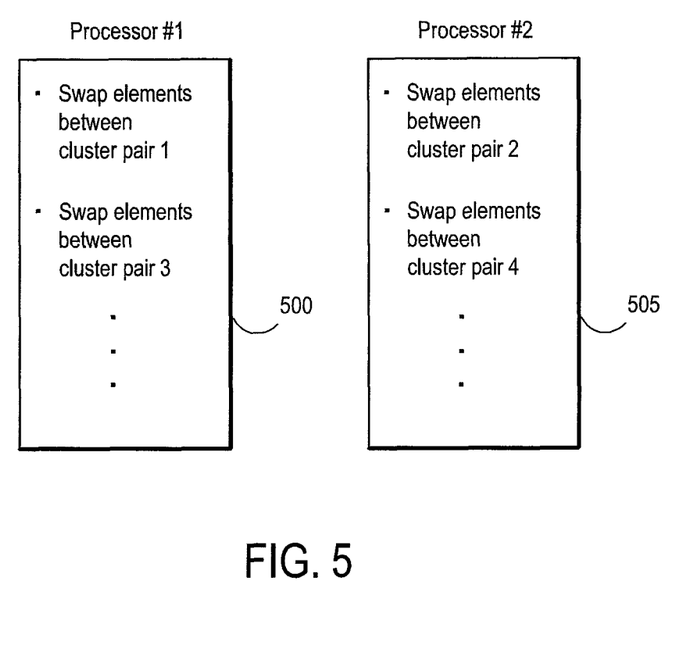
FIG. 5 illustrates a simplified block diagram of clustering parallelization using iterative improvement according to an exemplary embodiment.

FIG. 5 illustrates a simplified block diagram of clustering parallelization using iterative improvement according to an exemplary embodiment. Processor #1 performs a set of tasks 500, which includes swapping elements between a cluster pair, say, cluster pair 1, and swapping elements between cluster pair 3. In parallel with those swapping operations, processor #2 performs a set of tasks 505, which includes swapping elements between cluster pair 2, and swapping elements between cluster pair 4.

This procedure may be repeated many times, each time selecting a different pair of clusters to swap between (possibly with randomly selected pairs and possibly with pairs selected by some heuristic—e.g., pairs of clusters whose elements have at least one connection between them).

One can apply the concepts described in the U.S. patent application Ser. No. 11/382,215, referenced above, to this iterative improvement algorithm to improve its run-time. Since the algorithm involves selecting pairs of clusters and then swapping elements between them, a set of pairs can be processed at the same time as long as none of the clusters are in more than one of the pairs in the set. For example, assume there are 100 clusters, and the iterative improvement algorithm was going to process the following pairs: (1,2) (3,4) (5,6) (1,6) (2,4), etc.

One can maintain identical results to the non-parallel version of the algorithm by allowing the first three pairs to be processed simultaneously. The fourth pair (1,6) should wait until the previous pairs are finished since it involves clusters that are already being modified in the previous pairs (1 is modified in (1,2) and 6 in (5,6)). The queue (or set) models presented in U.S. patent application Ser. No. 11/382,215, referenced above, can be used to load a list of cluster pairs that are independent of each other, and therefore can be processed in parallel. Processing the cluster pairs in parallel provides the benefits described here and also in U.S. patent application Ser. No. 11/382,215, referenced above.

(c) Placement Move-Level Multi-Threading

Placement algorithms (e.g., placement of resources within or in an IC, such as a PLD) often use iterative improvement algorithms to improve existing placements. One example of an iterative improvement algorithm makes "moves" or changes to an existing placement, and then uses a cost function to evaluate whether the move was worthwhile (the cost function could consider a relatively large number of goals including placement legality, overlap between blocks, timing, routability, power, etc.).

Late in an iterative improvement algorithm like this, the placement is often relatively good, making it relatively difficult to find changes to the placement that improve the cost function. If multiple processors are available, the algorithm can use each processor to explore one move or change, regardless of any dependencies. The algorithm can then accept the best move from all those that were tried. This is or tends to be most useful relatively late in the process because the chance of finding multiple good moves is relatively low.

Notice that accepting more than one move can be unsafe because there may be dependencies between the moves that make the evaluation of the cost function incorrect. For example, consider two moves: the first moves block A closer to block B to which it is connected, and the second moves block B closer to block A. Both of these moves can seem like good ones if A and B are important or desirable to put close together, but if both moves are accepted, block A and B will be "chasing each other" and the placement may not improve. A possible improvement on this would be to check for dependencies and accept more than one move if there are no dependencies that disqualify the cost computations performed.

(d) Placement Configuration Evaluation Multi-Threading

Many placement algorithms involve a cost function of some form that the algorithm tries to minimize (an equivalent way of saying this is that the algorithm involves a "goodness function" that it tries to maximize). These cost functions can attempt to measure the quality of one or more of the following: routability metrics (such as quadratic wirelength, manhattan wirelength, whitespace allocation, congestion hot-spot avoidance), performance metrics (measured by considering things like connection delay, user timing requirements for various paths, results from a previous timing analysis, etc.), power metrics (such as static power dissipation and dynamic power dissipation), and legality metrics (amount of overlap, severity of overlap, too many signals need to enter a region, etc.).

Computing these values is often a significant part of the overall algorithm run-time, both because there are often many metrics and because changes to all these metrics are computed every time a placement change is being evaluated.

A system with multiple processors can be used to multi-thread or parallelize the cost computations. This is possible because many of the metrics that are computed are often completely independent of each other (for example, the computation of overlap in the placement does not depend at all on the calculation of manhattan wirelength and vice versa, hence they can be done safely in parallel).

The advantage of this approach is that it can reduce compilation time without changing the algorithm and without requiring the queues and dependency checking described in U.S. patent application Ser. No. 11/382,215, referenced above.

Note that some embodiments may treat metrics in a pass or fail manner. That is, a placement configuration may be rejected outright because it is illegal or fails timing; in those cases, the relevant evaluations can be thought of as checks rather than metrics, but the techniques above still apply, and independent checks can be performed, in parallel, with each other and with metric computation.

(e) Floorplan-Level Placement Multi-Threading

Multi-threading of placement algorithms is made difficult by the tracking of dependencies. When modifying one part of the placement, any other part that is connected to it, or resides in regions related to where the modification is occurring, cannot be modified until the first modification is complete.

When using multiple processors to run a placement algorithm that uses moves (e.g., iterative improvement algorithms such as simulated annealing), one way of solving this difficulty is to give each processor a separate region of the chip (would usually be rectangular and non-overlapping, but can also be other shapes and potentially have overlap, although overlap would introduce some dependencies between regions). A processor would make moves that affect nodes in the region it has been assigned.

Figure 6:
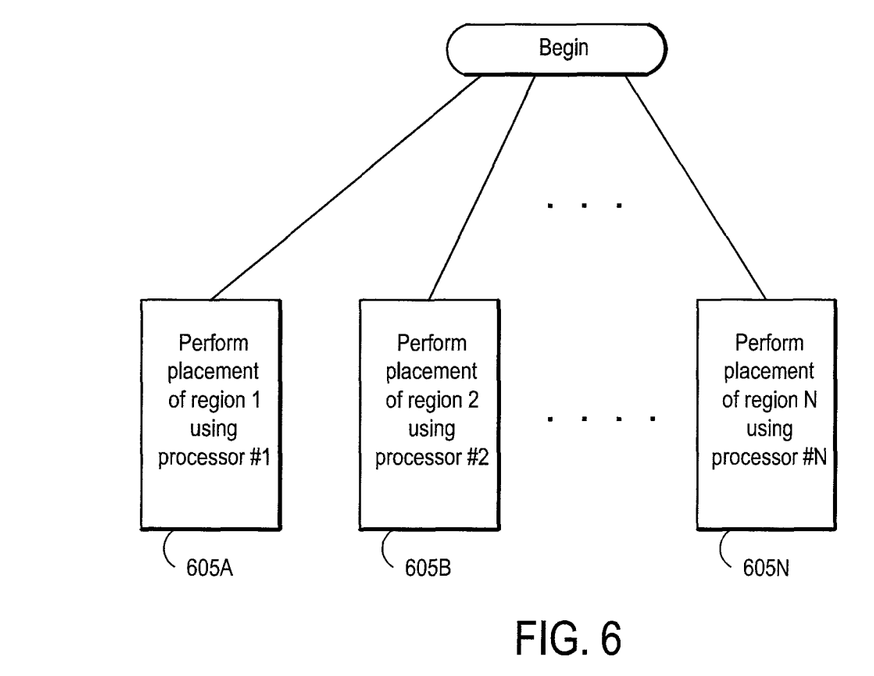
FIG. 6 depicts a simplified flowchart of a method for placement using multiple processors according to an exemplary embodiment.

FIG. 6 depicts a simplified flowchart of a method for placement using multiple processors according to an exemplary embodiment. Assuming that N processors are available, one divides the IC or PLD into N regions. Each processor performs placement on a corresponding region. For example, referring to FIG. 6, at 605A processor #1 performs placement for region 1, at 605B processor #2 performs placement for region 2, and so on. Finally, at 605N, processor #N performs placement for region N. Note that the placements are performed in parallel.

For connections that travel outside the region it is given, the processor needs to make a static assumption about the blocks in other regions to create independence. One possibility is to assume that those blocks are fixed in the location where they were when the last synchronization between threads happened (even though in reality, other processors may be moving the blocks in other regions). From time to time, the locations for each block outside its region can be refreshed for each processor. A second possibility is to project connections outside the region to a point on the region (known as "terminal propagation" in partitioning-based algorithms), and assume those points as static during optimization to create independence.

Instead of allocating regions of the chip statically, they can be allocated dynamically to processors according to some analysis of the design. For example, if it is determined that a particular area of the chip is congested for a particular placement, the placement algorithm can assign more processors to work on sub-areas within that area of the chip. Alternatively, regions can be selected so as to yield greater independence, based on the design and the current layout, even if that means unequal-sized or non-rectangular regions.

(f) Multi-Threading of Partitioning-Based Placement Algorithms

A similar idea to part (e) above can be used for partitioning-based placement algorithms which recursively partition the netlist into two groups. Since a given partitioning step is working on a particular section of the netlist, other partitioning steps can happen in parallel. Each processor can work on partitioning the section of the netlist assigned to it, while assuming that all other nodes in the netlist have been partitioned to the point that they were when the processor started (by using the terminal propagation technique mentioned in part (e) above).

Figure 7:
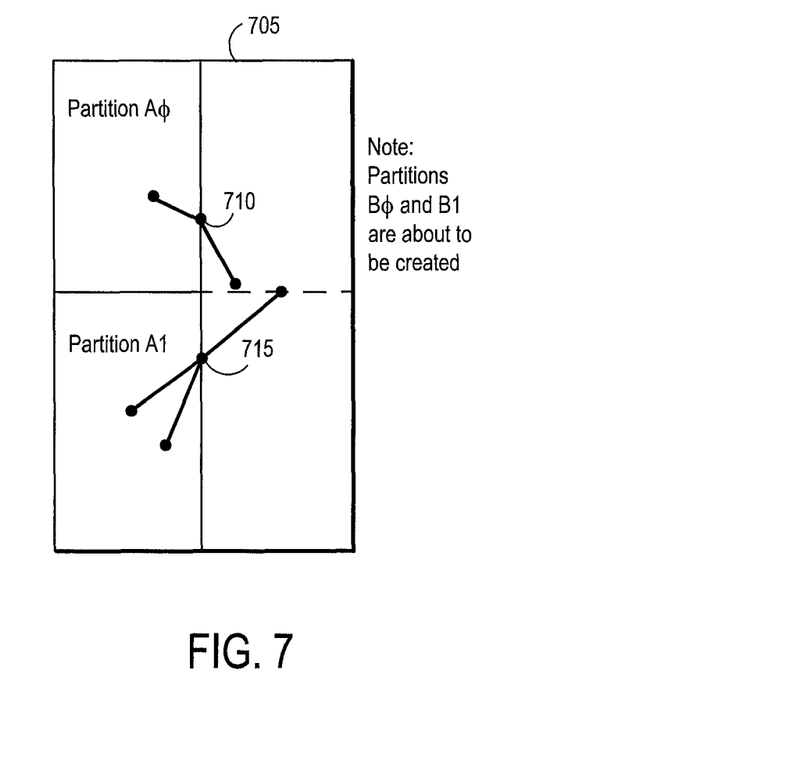
FIG. 7 shows the operation of terminal propagation to aid placement partitioning according to an exemplary embodiment.

So far, terminal propagation has been discussed with regard to creating independence. Terminal details are propagated to the border of the region under consideration, to abstract them away and "freeze" their states. In addition to creating independence, however, terminal propagation during recursive partitioning can be useful for quality because it communicates information about previous partitioning decisions to help guide creation of subsequent partitions. FIG. 7 shows the operation of terminal propagation to aid placement partitioning according to an exemplary embodiment. Suppose that one has partitioned netlist 705 into partitions A0 and A1. Once partition A0 and A1 have been created, that information can be used to guide partitioning of the rest of netlist 705 (i.e., partition the right half to generate B0 and B1). Terminal 710 and terminal 715 constitute terminals propagated to the border of the right half of netlist 705. They indicate that the left terminal in B0/B1 would want to be in the upper partition (B0) and the right terminal on the lower (B1).

By doing more partitioning in parallel, this communication cannot happen as efficiently because the decisions are being made at or about the same time. For example, if the partitioning algorithm is making A0/A1 and B0/B1 partitions at the same time, it is relatively hard to ensure a good partitioning is created.

To address this issue, the algorithm could avoid parallelizing partitions that contain much related logic or circuitry. Although terminal propagation with stale data can be used to eliminate any dependencies between partitions, the algorithm should still try to minimize parallelizing partitions with higher numbers of dependencies for quality reasons.

To do so, one can use a scheduler that determines which partitions can be created in parallel. When there are many connections that are related, and so could use information from terminal propagation to improve partitioning quality, the scheduler would prevent those partitions from being created in parallel. Where such related connections do not exist, it would allow parallel partitioning. A scheduler of this type allows the algorithm to achieve speedup without sacrificing much partitioning quality. The scheduler's aggressiveness could be adjusted depending on the user's (or software vendor's) desired quality/run-time tradeoff.

Another way to deal with this issue is to have the scheduler consider partitions for re-partitioning. In partitioners, it can be useful to re-partition already partitioned portions of the design. The advantage of doing this is to leverage more current or more detailed placement information. Using the partition labels of the above example, if A has been partitioned into A0 and A1, and B is partitioned based on the partitioning of A, the results can still be sub-optimal because the partitioning of A did not consider how B would like to be or should be partitioned.

One approach is to partition A, partition B based on the partitioning of A, then re-partition A based on the partitioning of B, and then re-partition B based on the current partitioning of A. Re-partitioning gives a scheduler a relatively large number of opportunities for parallelization, because when a partition is tentatively partitioned, it is often not necessary that the tentative partitioning be fully optimized (so working with stale data is more tolerable).

Partitioning-based placement algorithms often have multiple re-starts at various levels. For example, to just partition A into A0 and A1, several partitioning runs may be tried with different initial configurations—since partitioning is often sensitive to initial configuration. The best result from those attempts may be chosen (a way of avoiding local minima). Similarly, a sequence of outer-loop partitioning steps may be re-started, each of which have individual partitioning attempts with re-starts, and the best overall result can be chosen. For example, the algorithm might partition down several levels (half of the chip, then quarters of the chip, then eights of the chip) and then re-start at the beginning to see if it can find a better result. Sometimes initial configurations are chosen from previous partitioning results, but sometimes they are not. All these re-starts can be subject to parallelization using the techniques already discussed—even if some of the re-starts are dependent on the outputs of previous steps (by handling the appropriate dependencies as already discussed).

(g) Multi-Threading of Analytic Placement Algorithms

The concepts described in this patent document and in U.S. patent application Ser. No. 11/382,215, referenced above, can also be applied to quadratic or analytic placement algorithms (using a spring model of the placement problem, so as to achieve a minimum-energy model for all springs, as persons of ordinary skill in the art who have the benefit of the description of the disclosed concepts understand). This class of algorithm usually involves computing new locations for each block or cluster in the netlist based on spring forces established between connected blocks in the netlist. To make the placement converge towards a legal solution (with minimal overlap), forces or constraints are often computed and applied, over several iterations to spread the blocks, or move them away from heavily congested areas or areas where they are overlapping with a relatively large number of other blocks.

Figure 8:
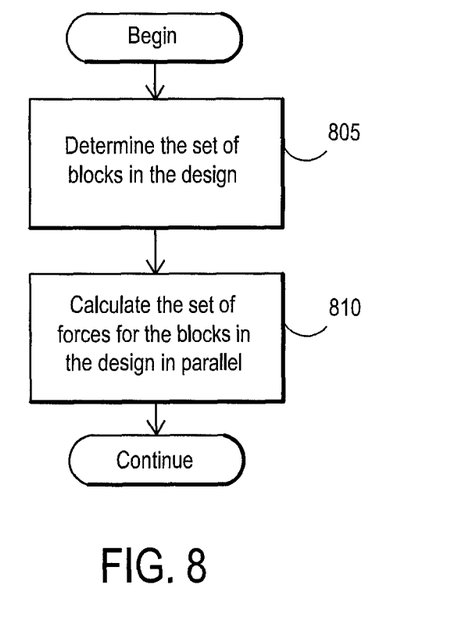
FIG. 8 illustrates a simplified flowchart of a method for parallelized analytic placement according to an exemplary embodiment.

To multi-thread or parallelize an analytic placement algorithm, the computation of these forces or constraints can easily be parallelized since the force or constraint for each block can be computed as a function only of the current location of all the blocks, making each block's force or constraint computation independent of that being performed for other blocks. This is a similar concept to the one discussed in part (d) above. FIG. 8 illustrates a simplified flowchart of a method for parallelized analytic placement according to an exemplary embodiment. At 805, the set of blocks for the design, netlist, circuit, etc. is determined. At 810, the set of forces for the blocks (i.e., the set of forces that includes the force for each corresponding block) is computed in parallel.

Figure 9:
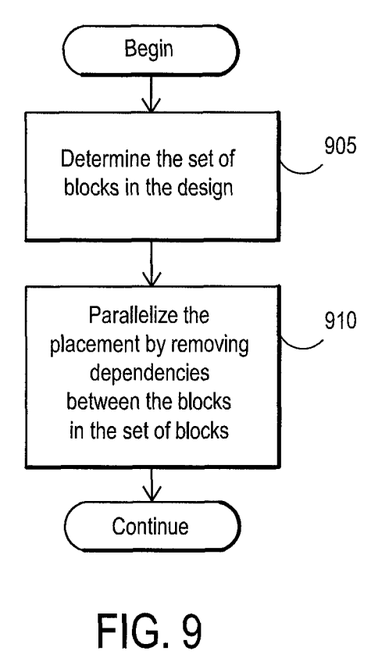
FIG. 9 depicts a simplified flowchart of another method for parallelized analytic placement according to an exemplary embodiment.

Another embodiment can apply constraints to both achieve legalization and enable parallelism by removing dependencies between portions or blocks of the design. FIG. 9 depicts a simplified flowchart of another method for parallelized analytic placement according to an exemplary embodiment. At 905, the set of blocks for the design, netlist, circuit, etc. is determined. At 910, the analytic placement is parallelized by removing dependencies between the blocks in the set of blocks identified at 905. Some analytic placement legalization techniques involve partitioning (either using minimum cut or minimum movement) to try to "spread" or balance an illegal analytic placement across the placement area. The various partitioning steps can be parallelized using the techniques in part (f) above. Further parallelization can be achieved, however, by utilizing pseudo-terminals to enforce legalization and remove dependencies. When blocks are partitioned into regions, a technique similar to terminal propagation can be used to constrain those blocks to the relevant partitions.

In this approach, pseudo-terminals are created at the boundaries of the partitions so that all the blocks assigned to a partition connect to each other and the pseudo-terminals on their boundaries. That way, the blocks have no incentive to leave the regions to which they are assigned. This pseudo-terminal creation essentially divides the analytic placement problem into smaller sub-problems—each of which can be solved in parallel with each other (for example, independent matrix problems to solve) and, potentially, run in parallel with partitioning steps. Note that when parallelizing analytic placement along these lines, the same considerations discussed in part (f) above apply here as well. For example, a scheduler may be needed to manage the runtime versus quality tradeoff, with regard to serializing certain processing for better quality.

Figure 10:
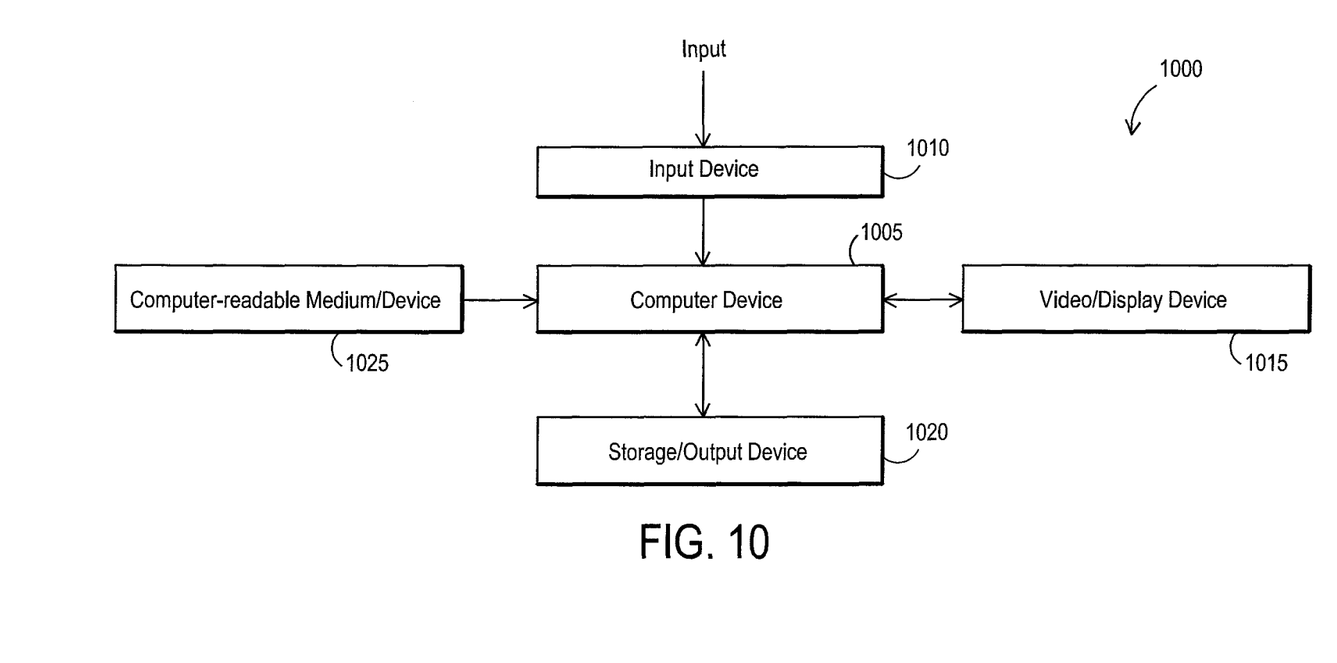
FIG. 10 shows a block diagram of a system for processing information using the disclosed concepts.

As noted above, one may run or execute algorithms or software according to the disclosed concepts on computer systems or processors. FIG. 10 shows a block diagram of an exemplary system for processing information according to the disclosed concepts.

System 1000 includes a computer device 1005, an input device 1010, a video/display device 1015, and a storage/output device 1020, although one may include more than one of each of those devices, as desired.

The computer device 1005 couples to the input device 1010, the video/display device 1015, and the storage/output device 1020. The system 1000 may include more that one computer device 1005, for example, a set of associated computer devices or systems, as desired.

The system 1000 operates in association with input from a user. The user input typically causes the system 1000 to perform specific desired information-processing tasks, including circuit simulation. The system 1000 in part uses the computer device 1005 to perform those tasks. The computer device 1005 includes an information-processing circuitry, such as a central-processing unit (CPU), although one may use more than one CPU or information-processing circuitry, as persons skilled in the art would understand.

The input device 1010 receives input from the user and makes that input available to the computer device 1005 for processing. The user input may include data, instructions, or both, as desired. The input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to the computer device 1005. Similarly, the user operates the pointing device to provide cursor position or control information to the computer device 1005.

The video/display device 1015 displays visual images to the user. The visual images may include information about the operation of the computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to the computer device 1005.

The storage/output device 1020 allows the computer device 1005 to store information for additional processing or later retrieval (e.g., softcopy), to present information in various forms (e.g., hardcopy), or both. As an example, the storage/output device 1020 may constitute a magnetic, optical, or magneto-optical drive capable of storing information on a desired medium and in a desired format. As another example, the storage/output device 1020 may constitute a printer, plotter, or other output device to generate printed or plotted expressions of the information from the computer device 1005.

The computer-readable medium 1025 interrelates structurally and functionally to the computer device 1005. The computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by the computer-readable medium 1025, the functional descriptive material imparts functionality. The functional descriptive material interrelates to the computer-readable medium 1025.

Information structures within the functional descriptive material define structural and functional interrelations between the information structures and the computer-readable medium 1025 and/or other aspects of the system 1000. These interrelations permit the realization of the information structures' functionality. Moreover, within such functional descriptive material, computer programs define structural and functional interrelations between the computer programs and the computer-readable medium 1025 and other aspects of the system 1000. These interrelations permit the realization of the computer programs' functionality.

By way of illustration, the computer device 1005 reads, accesses, or copies functional descriptive material into a computer memory (not shown explicitly in the figure) of the computer device 1005. The computer device 1005 performs operations in response to the material present in the computer memory. The computer device 1005 may perform the operations of processing a computer application that causes the computer device 1005 to perform additional operations. Accordingly, the functional descriptive material exhibits a functional interrelation with the way the computer device 1005 executes processes and performs operations.

Furthermore, the computer-readable medium 1025 constitutes an apparatus from which the computer device 1005 may access computer information, programs, code, and/or applications. The computer device 1005 may process the information, programs, code, and/or applications that cause the computer device 1005 to perform additional operations.

Note that one may implement the computer-readable medium 1025 in a variety of ways, as persons of ordinary skill in the art would understand. For example, memory within the computer device 1005 may constitute a computer-readable medium 1025, as desired. Alternatively, the computer-readable medium 1025 may include a set of associated, interrelated, coupled (e.g., through conductors, fibers, etc.), or networked computer-readable media, for example, when the computer device 1005 receives the functional descriptive material from a network of computer devices or information-processing systems. Note that the computer device 1005 may receive the functional descriptive material from the computer-readable medium 1025, the network, or both, as desired.

One may apply the disclosed concepts effectively to the fabrication or use of various ICs such as standard cell ICs, gate arrays, structured ASICs, and programmable logic devices (PLDs). Programmable logic devices include programmable or configurable logic circuitry and/or routing, and may be known by other names in the art, as desired, and as persons skilled in the art with the benefit of this disclosure understand. Examples of such circuitry include devices known as complex programmable logic devices (CPLDs), programmable gate arrays (PGAs), and field programmable gate arrays (FPGAs).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as the presently preferred or illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A system for parallelizing software in computer-aided design (CAD) software that designs a netlist describing a logic design for an integrated circuit, the system comprising:
   computing equipment having a plurality of processors, wherein the plurality of processors form a plurality of groupings of logic elements that are identified by the netlist for the logic design in parallel, wherein each grouping in the plurality of groupings comprises a subset of the logic elements identified by the netlist, wherein logic elements within a first grouping in the plurality of groupings are placed in a first portion of the logic design, wherein logic elements within a second grouping in the plurality of groupings are concurrently placed in a second portion of the logic design that is different from the first portion of the logic design, wherein the computer-aided design software generates a bitstream based on the netlist, and wherein the integrated circuit implements the logic design when loaded with the bitstream.

2. The system according to claim 1, wherein each grouping within the plurality of groupings is formed in parallel.

3. The system according to claim 2, wherein each grouping in the plurality of groupings is from substantially independent portions of the design.

4. The system according to claim 1, wherein the integrated circuit comprises a programmable logic device.

5. A system for parallelizing software in computer-aided design (CAD) software that designs a netlist describing a logic design for an integrated circuit, the system comprising:
   computing equipment having a plurality of processors, wherein the logic design includes information describing logic elements and interconnection between the logic elements within the integrated circuit, wherein the plurality of processors concurrently group the logic elements within the integrated circuit into multiple clusters of different subsets of the logic elements and perform cluster affinity updates for each of the multiple clusters in parallel, wherein the cluster affinity updates include operations to update each cluster of the different subsets of the logic elements based on the interconnections between the logic elements, wherein the computer-aided design software generates configuration data based on the netlist, and wherein the integrated circuit is configured to implement the logic design described by the netlist when loaded with the configuration data.

6. The system according to claim 5, wherein the integrated circuit comprises a programmable logic device, and wherein the logic design is implemented by using programmable resources of the programmable logic device.

7. A system for parallelizing software in computer-aided design (CAD) software that designs a netlist describing a logic design for an integrated circuit that implements the logic design when loaded with bitstream data, the system comprising:
   computing equipment having a plurality of cores, wherein the bitstream data is generated from a netlist that includes logic design information describing logic elements and interconnections between the logic elements within the integrated circuit, wherein the logic elements are grouped into a plurality of clusters, wherein the plurality of cores optimize the plurality of clusters in parallel by identifying exchanges of logic elements between different clusters to minimize at least one cost function associated with the logic design, and wherein only a subset of identified exchanges are implemented within the logic design.

8. The system according to claim 7, wherein a queue of independent tasks stores the identified exchanges to be processed in parallel.

9. The system according to claim 7, wherein the integrated circuit comprises a programmable logic device, and wherein the programmable logic device is configured using programmable resources of the programmable logic device.

10. A system for parallelizing software in computer-aided design (CAD) software for processing a netlist that describes a logic design to generate a bitstream for configuring an integrated circuit, the system comprising:
computing equipment having a plurality of processing resources, wherein the integrated circuit implements the logic design when loaded with the bitstream generated by the computer-aided design software by processing the netlist, wherein the netlist identifies logic elements for the logic design, wherein the plurality of processing resources concurrently determine placements for different blocks of the logic elements identified by the netlist by performing a set of operations in parallel, and wherein each operation of the set of operations uses a different portion of the netlist.

11. The system according to claim 10, wherein the set of operations comprises a set of move operations.

12. The system according to claim 11, wherein the computing equipment performs a given move operation within the set of move operations.

13. The system according to claim 11, wherein the computing equipment performs a plurality of move operations within the set of move operations in parallel if the plurality of move operations are independent.

14. The system according to claim 11, wherein the computing equipment performs in parallel a plurality of cost computations for each move operation in the set of move operations.

15. The system according to claim 11, wherein the computing equipment performs in parallel a plurality of legality computations for each move operation in the set of move operations.

16. The system according to claim 11, wherein each processing resource in the plurality of processing resources performs move operations for a corresponding region of the integrated circuit (IC).

17. The system according to claim 16, wherein the integrated circuit (IC) comprises a programmable logic device (PLD).

18. The system according to claim 16, wherein the computing equipment assigns disjoint regions of the integrated circuit (IC) to the plurality of processing resources.

19. The system according to claim 18, wherein the computing equipment uses terminal propagation to increase processing resource independence.

20. The system according to claim 18, wherein the computing equipment uses fixed terminal locations to increase processing resource independence.

21. The system according to claim 16, wherein a size of a given region of the integrated circuit (IC) is a function of an optimization needed for the given region of the integrated circuit (IC).

22. The system according to claim 16, wherein the computer equipment increases thread independence by allocating a first size to a first given corresponding region and a second size to a second given corresponding region, wherein the first size is different from the second size.

23. The system according to claim 10, wherein the computing equipment determines placements for the different blocks of the logic elements identified by the netlist by performing recursive partitioning of the netlist.

24. The system according to claim 23, wherein the computing equipment performs recursive partitioning of the netlist in parallel.

25. The system according to claim 24, wherein the computing equipment uses a scheduler to determine groups of the different blocks to be partitioned in parallel.

26. The system according to claim 25, wherein the scheduler partitions related blocks in the groups of the different blocks in parallel if the blocks are to be subsequently re-partitioned.

27. The system according to claim 23,
wherein the integrated circuit (IC) comprises a programmable logic device (PLD).

28. The system according to claim 10, wherein the computing equipment determines placement for the different blocks of the logic elements identified by the netlist by performing analytic placement of the different blocks.

29. The system according to claim 28, wherein the computing equipment computes a set of constraints.

30. The system according to claim 28, wherein the computing equipment inserts pseudo-terminals when performing the analytic placement of the different blocks.

31. The system according to claim 30, wherein the different blocks comprise first and second plurality of blocks, and wherein computing equipment performs the analytic placement of the first plurality of blocks in parallel with partitioning of the second plurality of blocks.

32. The system according to claim 30, wherein the computing equipment uses a scheduler to determine groups of the different blocks to be partitioned in parallel.

33. The system according to claim 28, wherein the integrated circuit (IC) comprises a programmable logic device (PLD).

* * * * *